United States Patent [19]

Abrams

[11] 4,003,756
[45] Jan. 18, 1977

[54] DEVICE FOR CONVERTING SUNLIGHT INTO ELECTRICITY

[75] Inventor: Eugene Abrams, Franklin Square, N.Y.

[73] Assignee: Solar Dynamics Corporation, Franklin Square, N.Y.

[22] Filed: Mar. 7, 1974

[21] Appl. No.: 448,887

Related U.S. Application Data

[63] Continuation-in-part of Ser. No. 407,662, Oct. 18, 1973, abandoned, which is a continuation-in-part of Ser. No. 393,168, Aug. 30, 1973, abandoned.

[52] U.S. Cl. .................. 136/89 PC; 350/288; 350/293
[51] Int. Cl.² .................................. H01L 31/04
[58] Field of Search .................................. 136/89

[56] References Cited

UNITED STATES PATENTS

| | | | |
|---|---|---|---|
| 2,904,612 | 9/1959 | Regnier | 136/89 |
| 3,150,999 | 9/1964 | Rudenberg et al. | 136/89 |
| 3,231,426 | 1/1966 | Ludwig et al. | 136/4 |
| 3,490,950 | 1/1970 | Myer | 136/89 |
| 3,515,594 | 6/1970 | Samuels | 136/89 |

FOREIGN PATENTS OR APPLICATIONS

| | | | |
|---|---|---|---|
| 1,246,126 | 8/1967 | Germany | 136/89 |
| 1,089,018 | 9/1960 | Germany | 136/89 |
| 26,782 | 1910 | United Kingdom | 136/89 |

OTHER PUBLICATIONS

J. Davis, "Solar Cell R & D", pp. 44–46 in "Space/Aeronautics", Apr. 1959.

Primary Examiner—Anthony Skapars
Assistant Examiner—Aaron Weisstuch
Attorney, Agent, or Firm—Bauer, Amer & King

[57] ABSTRACT

An arrangement practical by its efficiency and cost of materials, for converting sunlight into electricity using silicon solar cells. The cells are disposed in facing relation such that sunlight in concentrated form, as provided by a cooperating sunlight-gathering lens, impinges thereon and also is inter-reflected between the cells, so that the electrical output is significantly enhanced.

6 Claims, 16 Drawing Figures

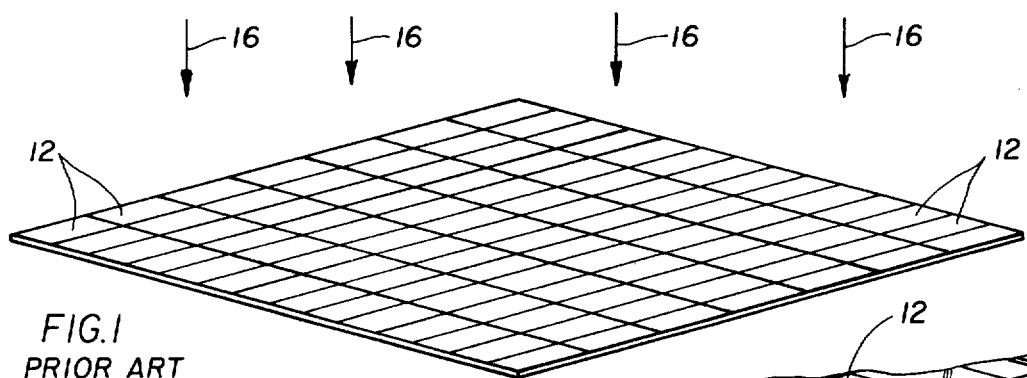
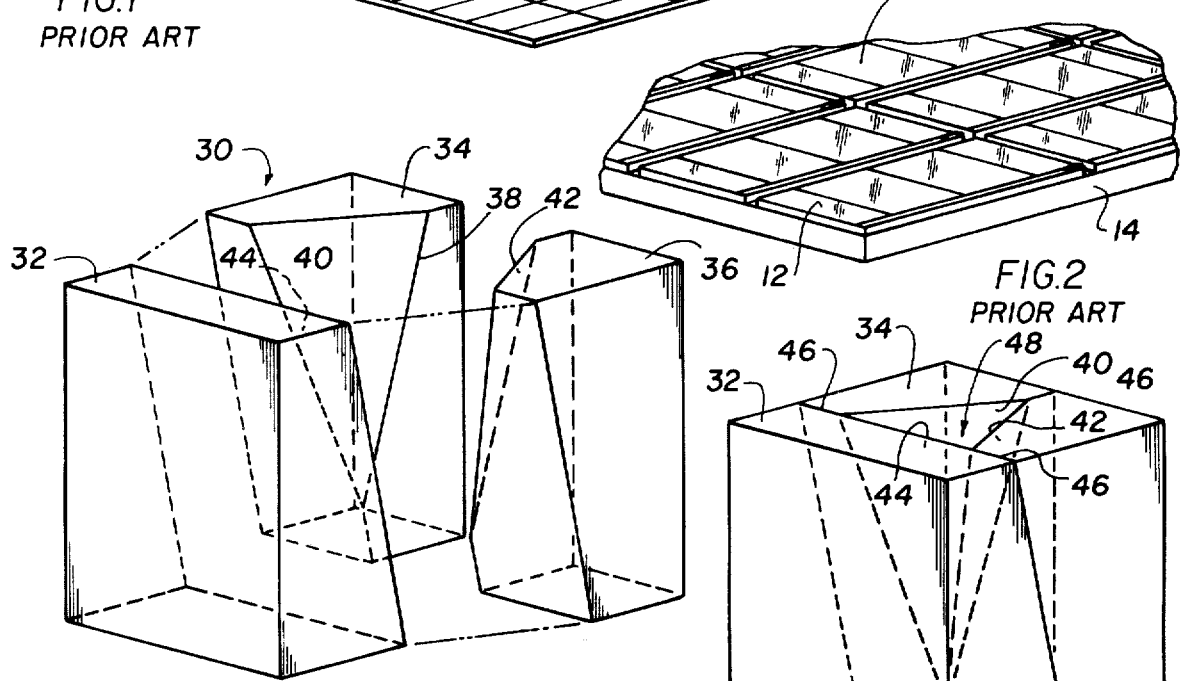
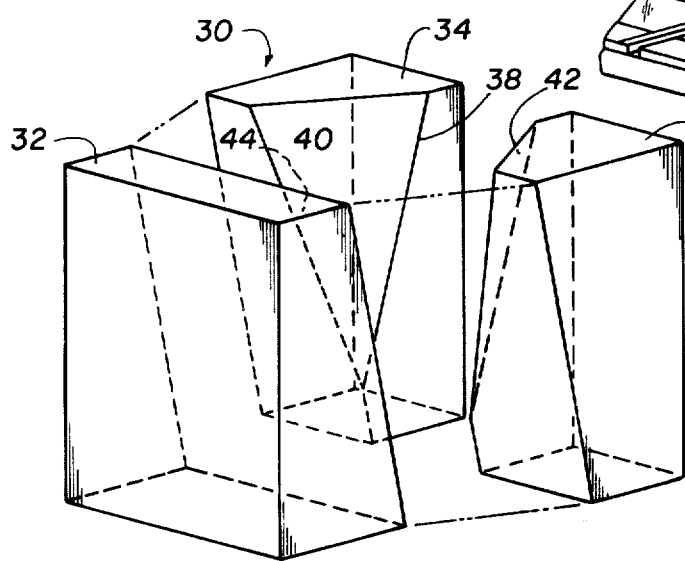
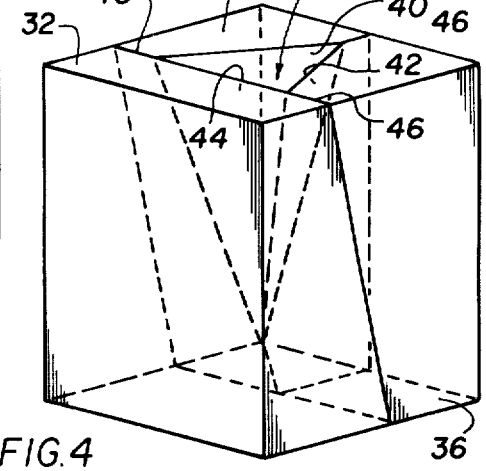
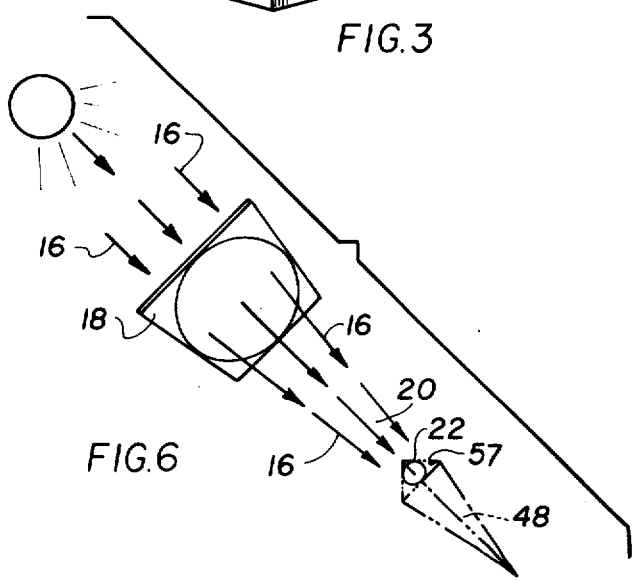
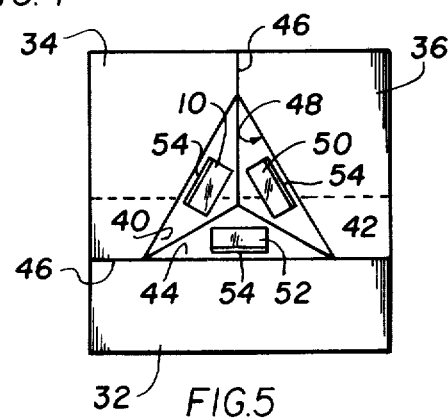

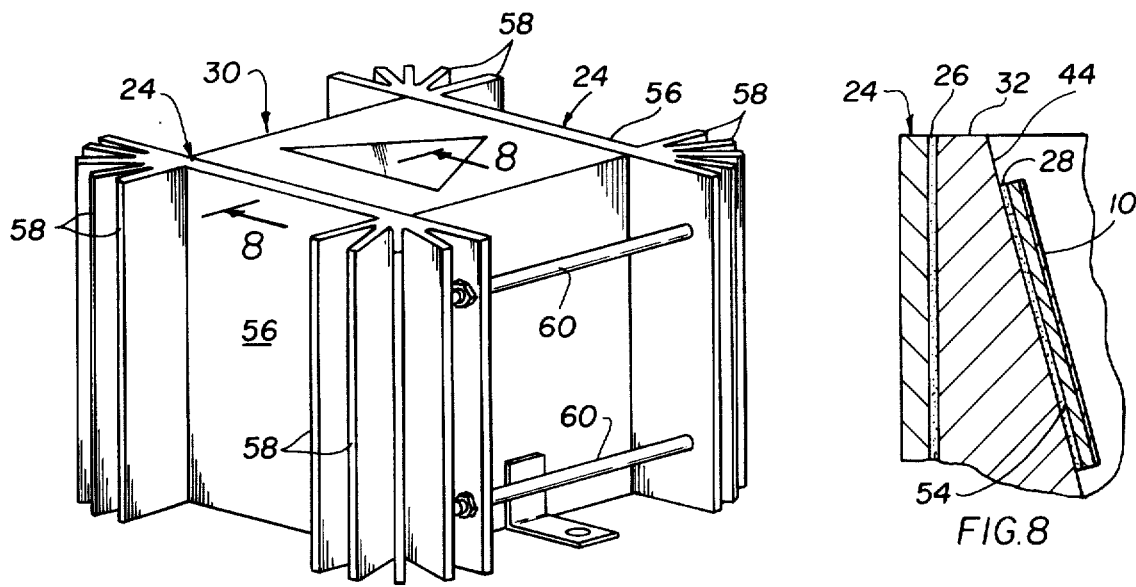
FIG.7
FIG.8
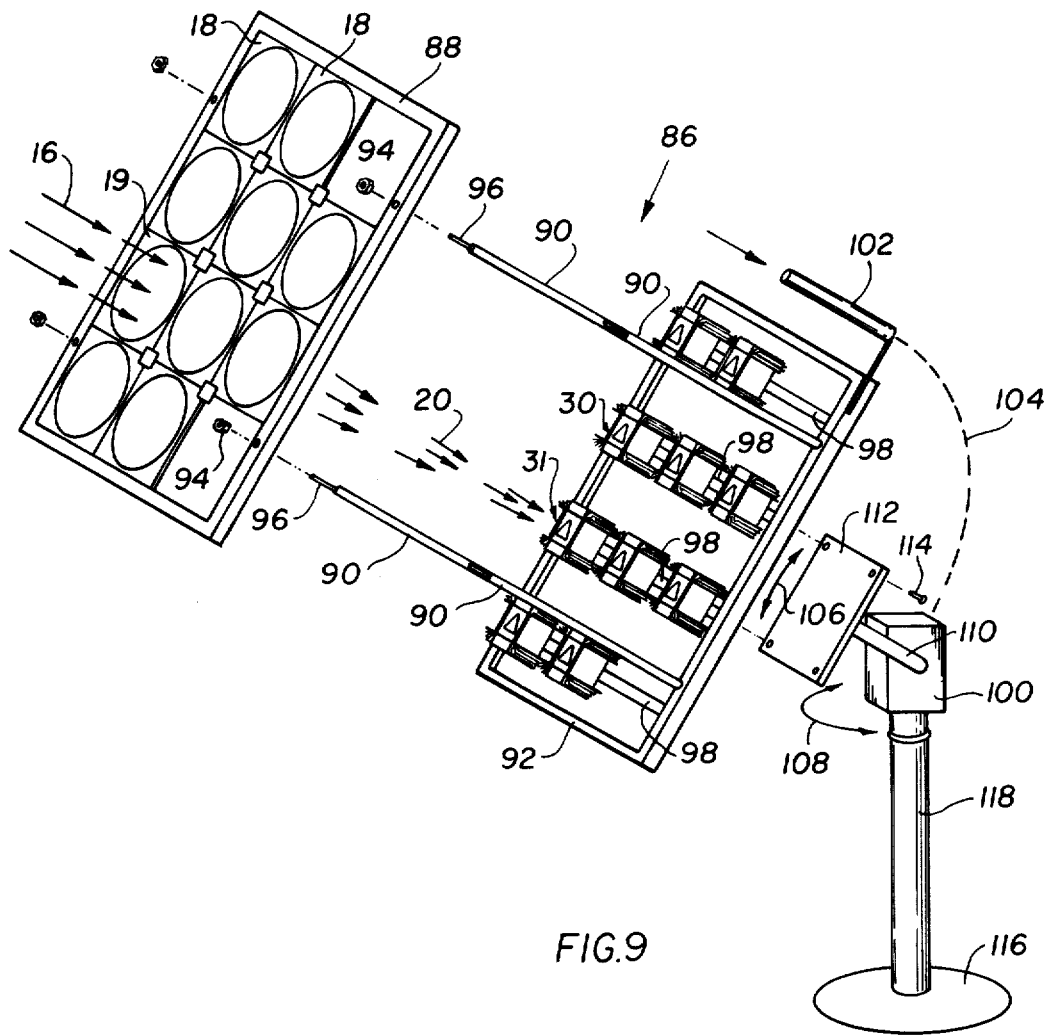
FIG.9

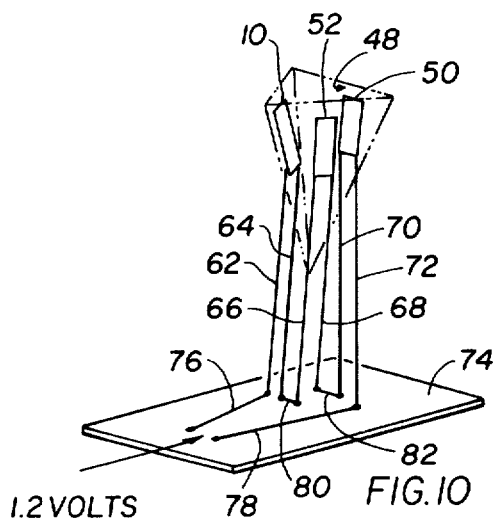
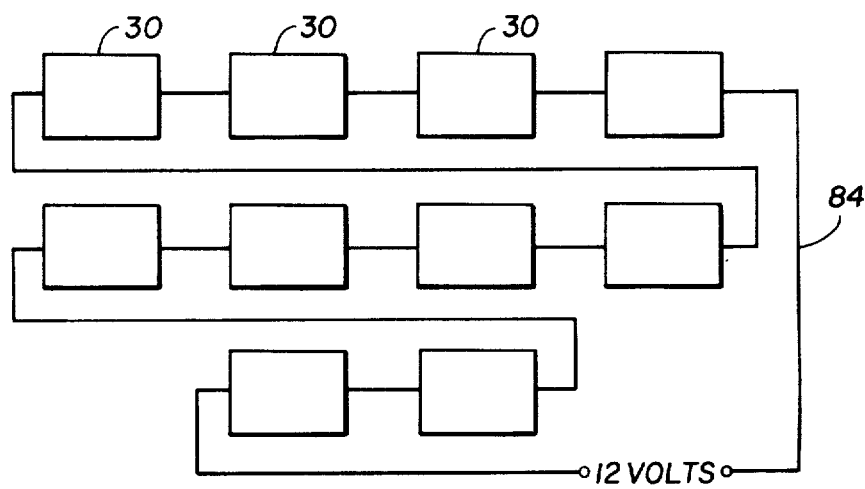
FIG.11

DEVICE FOR CONVERTING SUNLIGHT INTO ELECTRICITY

This is a continuation-in-part of application Ser. No. 407,662, filed Oct. 18, 1973, now abandoned, which is a continuation-in-part of application Ser. No. 393,168, filed Aug. 30, 1973, now abandoned.

The present invention relates to solar cell produced electricity, and more particularly to an improved arrangement for said cells and to an improved concentrated sunlight input for said arrangement, which significantly contribute to the practicality of solar energy becoming a power source for everyday domestic and industrial requirements.

Solar cell produced electricity, limited as it now is to side-by-side cell arrangements, is impractical for all but a satellite installation or the like, where cost is not a deterrent, or else for a low-power domestic or industrial function. Exemplifying the former, or satellite installation, is an 11,000 cell satellite solar panel (as described in Popular Science, August, 1973) having a cell cost exceeding $150,000; and exemplifying the latter is the use of said cells to operate camera shutters and the like. In either of the foregoing, and in all other prior art systems for obtaining solar cell produced electricity, owing to the highly unfavorable economics involved, there is no realistic prospect of solar energy becoming a significant power source for everyday domestic and industrial use.

An object of the preseent invention is to provide a practical, low-cost system for converting sunlight into electricity, using silicon solar cells, thereby overcoming the foregoing and other prior art shortcomings. Specifically, it is an object to so increase the efficiency of the electricity-producing function of said cell, not by modification of its chemistry, construction, or similar such attribute, but rather by improving its operating environment and capacity to efficiently absorb sunlight for subsequent conversion into electricity, that a practical, low-cost solar generator is readily constructed of said cells.

One device which exemplifies solar cell produced electricity with efficiency and practicality demonstrating objects and advantages of the present invention includes a cooperating combination of a Fresnel lens providing a generally conical projection of concentrated sunlight, and of a facing triangular arrangement of three said silicon solar cells positioned in the path of said concentrated sunlight conical projection so as to both intercept and inter-reflect said sunlight causing an optimum production of electricity therefrom.

Another device exemplifying the principles of the within invention includes an elongated arrangement of cooperating pairs of cells in facing relation on opposite sides of a V-shaped compartment having a rectangular entrance opening thereinto and a lens of Ronchi rulings operatively arranged to concentrate sunlight into said trough-like compartment for inter-reflection between said cells.

The above brief description, as well as further objects, features and advantages of the present invention, will be more fully appreciated by reference to the following detailed description of presently preferred, but nonetheless illustrative embodiments in accordance with the present invention, when taken in conjunction with the accompanying drawings wherein:

FIG. 1 is a perspective view of a prior art arrangement of electricity-producing solar cells;

FIG. 2 is a partial perspective view, on an enlarged scale, or said prior art arrangement of FIG. 1, but showing further structural features thereof. The remaining figures are related to the invention hereof.

FIG. 3 is a perspective view, partially diagramatic and in exploded form illustrating the noteworthy facing arrangement according to the present invention established by solar cell-supporting structure;

FIG. 4 is a perspective view similar to FIG. 3, but illustrating the cell-supporting structure in assembled condition;

FIG. 5 is a plan view of said facing arrangement for three cells according to the present invention, in which future structural details are illustrated;

FIG. 6 is a diagramatic view illustrating the manner, according to the present invention, in which sunlight is concentrated for impingement upon the solar cells;

FIG. 7 is a perspective view of the structure for supporting said arrangement of three solar cells and certain associated heat-dissipating structure;

FIG. 8 is a partial side elevational view, on an enlarged scale and in section taken on line 8-8 of FIG. 7, illustrating further structural details;

FIG. 9 is an exploded perspective view of the sunlight concentrating means, and of the solar cells and their associated structure;

FIG. 10 is a diagramatic view illustrating the series electrical connection of the cells in said three-cell arrangement;

FIG. 11 is a circuit diagram illustrating the electrical connection of a plurality of three-cell arrangements.

Figure 14:
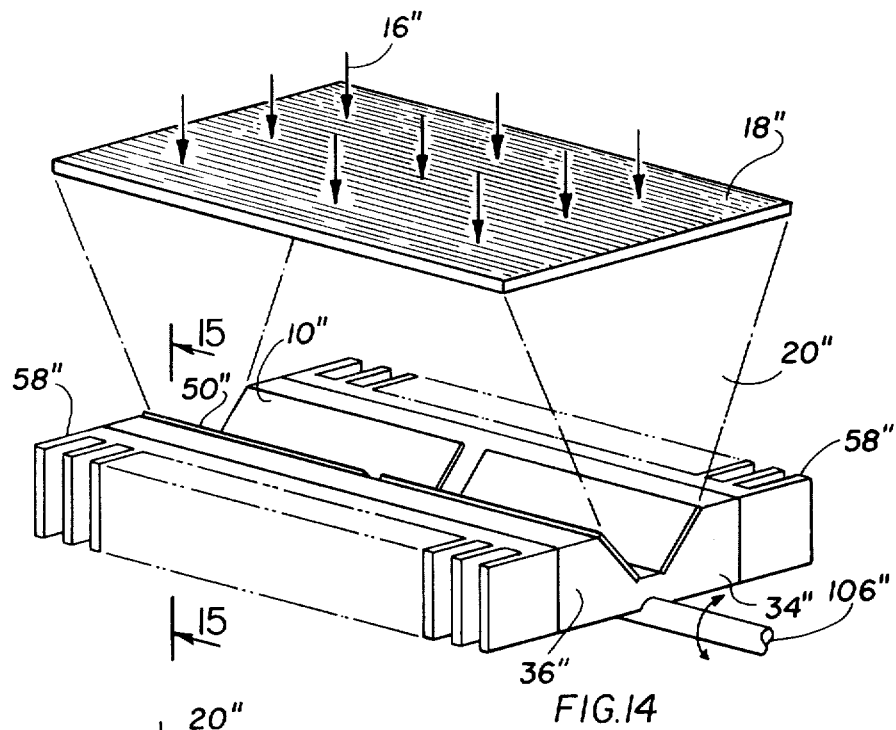
Figure 15:
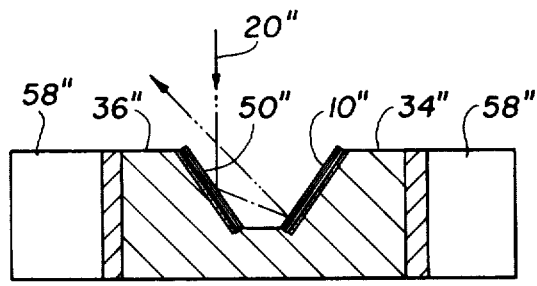
Figure 16:
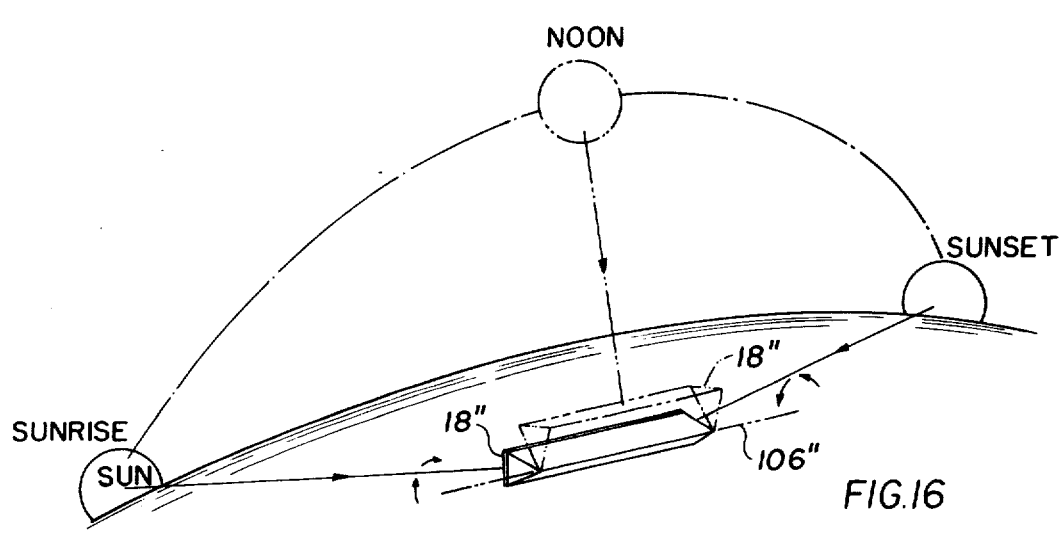

FIGS. 14, 15 and 16 illustrate still another embodiment of a solar cell electricity-producing arrangement according to the present invention. FIG. 14 is a perspective view thereof; FIG. 15 is a side elevational view, on an enlarged scale, taken on lines 15-16 of FIG. 14; and FIG. 16 is a diagramatic view illustrating the facilitated sun-tracking features of this embodiment.

Preliminary to describing the exemplary arrangements of solar cells which are regarded as the invention, it is advantageous to describe the components hereof since they are so few in number. The major component is a silicon solar cell, one said cell being identified by the reference number 10 in FIG. 5. This component can be purchased commercially, one source being Solar Systems, Inc., Skokie, Ill. The commercial embodiment of this cell which is available and which is used in the manner as will be described subsequently herein, consists of a small rectangular body approximately seven-eighths of an inch by three-eighths of an inch. As generally understood, these cells, of which said cell 10 is exemplary, produce electricity when sunlight impinges upon it.

An example of a prior art use of silicon solar cells is illustrated in FIGS. 1 and 2. Specifically, said cells, individually and collectively designated by the reference number 12, are typically arranged side-by-side, as illustrated, on a support panel 14. The thusly arranged front surface area of these cells 12 is then exposed to sunlight 16 and, in a generally well understood manner, electricity is thereupon produced as a result of the impingement of the sunlight 16 upon the cells 12. In a typical space-craft use, which FIGS. 1, 2 are intended to exemplify, there may be as many as 11,000 cells 12 used in the illustrated side-by-side arrangement, and said arrangement will typically produce approximately 300 watts from these series-connected cells.

The second significant component forming part of the within invention, is a sunlight-collecting device which for the embodiments of FIGS. 3—13 is in the specific form of a Fresnel lens, one such lens being identified by the reference number 18 in FIG. 9. A Fresnel lens satisfactory for use in concentrating sunlight in accordance with the present invention, as subsequently described herein, is available commercially, one suitable source being Edmund Scientific Co., Barrington, N.J. The commercial embodiment which is available and which is used in accordance with the present invention, is approximately 11⅞ inches square and has a focal length of approximately 13½ inches. This sunlight-gathering implement is particularly advantageously used herein because of the inaccurate, rather than the accurate, manner in which it does concentrate the sunlight. That is, as illustrated in FIG. 6, unlike a lens that has precise optical properties, said lens 18, in the specific form of a Fresnel lens, does not operate perfectly and the sunlight 16 impinging upon it and passing through it is accordingly concentrated into a conical beam 20 which at the focal point of the lens assumes the shape of a small circle 22, rather than a pin-point or similarly comparatively minute configuration. The significance of this will become apparent subsequently in the description.

Although it is the actinic light of the sunlight 16 which significantly contributes to the electricity-producing function of the solar cells used herein, unavoidably the concentrated sunlight beam 20 produced by the lens 18 has a greatly elevated temperature. This temperature, it is believed, at the principal focus of the lens, may be as high as 2000° F. Accordingly, to avoid disintegration of the solar cells, another component of the within invention is a heat-dissipating means or device, one such device being generally designated 24 in FIG. 7. Said devices, or heat sinks 24 are commercially available, one source being Tran-Pec Corporation, Columbus, Neb.

The final significant component used in accordance with the present invention is a dielectric epoxy adhesive with high thermal conductivity. This component, in the form of a layer or coating achieving an adhesive-attaching function, is designated by the reference numbers 26 and 28 in FIG. 8. Said adhesive is commercially available, one source being Wakefield Engineering Inc., Wakefield, Mass.

Reference is now made to the drawings, and in particular to FIG. 3, wherein there is shown support structure generally designated 30, for a basic three-cell arrangement according to the present invention. The three-cell support or unit 30 is preferably fabricated with three blocks, 32, 34, 36. The preferred material of construction of the blocks 32, 34, 36 is hardened aluminum, identified as 2024T4 purchased commercially from Kaiser Aluminum. Each block 34, 36 has one side which is machined in a generally triangular shape, thereby providing an angularly oriented surface 40. That is, just as block 34 is provided with surface 40, block 36 is provided with an angularly oriented surface 42, and the remaining block 32 is left with a flat inclined surface 44. As a result, when the blocks 32, 34 and 36 are joined together in a unified structure as illustrated in FIG. 4, as along the confronting sides 46, said angularly oriented surfaces 40, 42 and 44 of these blocks cooperate with each other to bound a pyramidal volume, generally designated 48.

As is perhaps best illustrated in FIG. 5, volume 48 is advantageously used as a compartment for said facing three cells arrangement according to the present invention. Such cells include the previously noted cell 10, and identical silicon solar cells 50 and 52. Thus, the significance of using the pyramidal volume 48 for the cells is that each said cell is readily adhesively secured, as along each rear cell surface 54 to each of the inclined surfaces 40, 42 and 44 respectively, with the obvious result that their front surfaces are in an advantageous facing relation to each other, all as illustrated in FIG. 5. This is in sharp contrast to the side-by-side arrangement characteristic of prior art practice using silicon solar cells, as exemplified by FIGS. 1, 2.

As diagramatically illustrated in FIG. 6, the concentrated beam of sunlight 20 produced by the Fresnel lens 18, in turn produces, as already noted, a cross-sectional shape which consists of a circle 22 at its principle focus. The diameter of circle 22 will be understood to be approximately equal to the diameter of a circle which just fits within the edges bounding the opening 57 of volume 48. As already noted, the imperfect focusing of the lens 18, in the specific form of a Fresnel lens, is particularly advantageous. That is, since the principal focus 22 occurs as a circle or spot of light rather than a pin-point, it does not pass through volume 48, but rather strikes the sides bounding said pyramidal volume. The sides, in turn, support the cells 10, 50 and 52, with the result that a typical ray of sunlight will impinge upon a first encountered cell, such as for example cell 10, and be reflected therefrom onto one of the other two facing cells, as for example cell 50, and only then perhaps be reflected out of the entrance opening 57. In other words, the sunlight 16 in the concentrated conical shape 20, enters into volume 48 and is reflected from one cell to the other thereby impinging upon at least two, and possibly more, of the cells 10, 50 and 52, before being reflected out of the volume. As a result of making at least two impingments as just noted, most of the light 16 is absorbed during the time that it is within the pyramidal volume 48, and this has been found, in practice, to significantly increase the efficiency of the electricity-producing capability of the cells 10, 50 and 52.

As generally understood, one of the materials of construction of a silicon solar cell is lead/tin solder. Such solder is known to melt or flow at a temperature of approximately 175° C. The temperature of the principal focus 22 of the concentrated sunlight 20, on the other hand, can be expected to greatly exceed said melting temperature. Thus, heat-dissipating means, such as means 24, are provided to dissipate the thermal content of the sunlight 16. This technique has proven very effective in experimentation by totally eliminating any damage to, or even inefficient operation of, the cells 10, 50 and 52, as a result of the high temperature of the principal focus 22.

As best illustrated in FIG. 7, each support 30 is provided with two heat sinks 24, each said heat sink being of a standard shaped plastic extrusion which includes a body 56 and heat-dissipating fins 58 in an appropriate radiating relation. The heat sinks 24 are preferably held, by bolts 60, in an arrangement in which the support 30 is in an interposed position therebetween, all as illustrated in FIG. 7. Additionally, as illustrated in FIG. 8, a coat of adhesive 26 is used to adhesively secure a heat sink 24 to the supporting block 32. As already noted, the requirement for the adhesive 26 is that it not be a conductor of electricity, so that it, along with the other components, effectively function as insulation for the electricity produced by the solar cells, such as cell 10. In this connection, and perhaps even more important because of its location, is the adhesive coating 28 which, as illustrated in FIG. 8, is utilized to adhesively secure, as along the rear cell surface 54, the cell 10 to the supporting surface 44. The high thermal conductivity of the adhesive contributes to effective removal of the thermal content from the sunlight 16 which impinges upon the cell 10, thereby avoiding the disintegration of cell 10 by the heat.

FIGS. 10 and 11, to which reference is now made, diagramatically illustrate the preferred electrical connection for each basic three-cell arrangement 30 (FIG. 10), and for a plurality of said arrangements 30 (FIG. 11). Specifically, electrically connected from cell 10 are conductors 62 and 64, from cell 52 conductors 66 and 68, and from remaining cell 50 conductors 70 and 72. Conductors 62 and 72 are connected to a printed circuit board 74 including outlet conductors 76 and 78. Also included on the printed circuit board 74 are conductors 80 and 82 which complete the series electrical connection of the three cells.

On a typical clear day with bright sunlight, at least a 1.2 volt output is usually, and has been, measured as being the output of the facing arrangement of cells 10, 50 and 52 illustrated in FIG. 10.

Illustrated in FIG. 11 are ten three-cell arrangements 30 which will be understood to be electrically connected in series by a conductor 84. Since conventional automobile batteries are rated at 12 volts, ten three-cell arrangements 30, similarly having at least a 12 volt output, were utilized in experiments verifying the noteworthy increased efficiency of the electricity-producing capability of silicon solar cells when provided with the arrangement, as described herein. It will be understood, however, that no limitation is intended by the selection of only ten three-cell arrangements 30, since clearly more or less than this number may be utilized in the practice of the present invention.

Reference should now be made to FIG. 9 in which there is illustrated a preferred, completely assembled, device, generally designated 86, for converting sunlight into electricity. Device 86 includes a first or outer frame 88, in which there is appropriately mounted ten identical, rectangular lenses 18, in the specific form of Fresnel lenses. Frame 88, with said lenses 18, is mounted in a clearance position from the solar cells on four support rods 90 which extend from a lower frame 92. Nuts 94 threadably engaged to bolts 96 complete the attachment of frame 88 to rods 90.

Appropriately mounted on cross pieces 98 of the frame 92 are ten three-cell arrangements 30, each similarly constructed in the manner already described in detail in connection with FIGS. 3–8 and 10,11. The cooperative relation of a three-cell unit 30 with a cooperating one of the Fresnel lenses 18, is that illustrated by the cell unit designated 31 and the Fresnel lens designated 19. Specifically, these components 19 and 31 are in an aligned relation such that the sunlight 16 impinging on the lens 19 is concentrated into a conical beam 20 which is focused towards and thus enters through the opening 56 of the pyramidal volume of the unit 31.

To achieve entry of the sunlight through the opening 57 requires proper orientation of the device 86 with respect to the sun. Additionally, since the position of the earth with respect to the sun is different at different times of the year, an appropriate sun-tracking device, diagramatically illustrated at 100 in FIG. 9, is required. The construction and mode of operation of such sun-tracking devices, such as device 100, are well understood, known and described in the literature, such as in U.S. Pat. No. 2,920,710, and thus, for the sake of brevity, such description is omitted. It suffices to note that such device 100 may be operated by a hunting servo, which includes a sun-sighting instrument 102 which provides an information feed-back 104 to the device 100 which results in appropriate sun-tracking movements 106 and 108. These movements enable device 86 to effectively track the sun during changes in relative position between the sun and the earth. To this end, device 100 includes a positioning arm 110 which has at its remote end a mounting bracket or panel 112 to which frame 92 is appropriately affixed, as by bolts 114.

Completing the device 86, and providing a desirable elevated position to the lenses and solar cells thereof, is a support having a base 116 and an upstanding post 118 in which device 100 is appropriately rotatively disposed.

It is generally known that the cost of a silicon solar cell, such as the cells 10, 50 and 52 described in connection with the within invention, is approximately $14 each. These are the same cells used in prior art arrangements, as exemplified by the arrangement of FIGS. 1, 2 wherein, as noted, to produce approximately 300 watts, as many as 11,000 cells may be required. The cost of prior art arrangements is thus enormous and probably explains why it is limited to end uses for space travel and the like. This severe limitation is also probably the basis for the statement in a publication of the U.S. Dept. of Interior, January, 1972, entitled "United States Energy", wherein on page 34 thereof, it is stated — "Owing to the highly unfavorable economics of solar cell produced electricity, it is very unlikely that solar energy will become a significant power source for many years." Thus, the within illustrated and described arrangement, by which a 12 volt output is possible using only 30 cells and entailing a correspondingly nominal cost compared to prior art practice, represents a significant and noteworthy advance in this art. Naturally, it will be understood that no limitation is intended by the selection of only ten three-cell arrangements, since clearly more or less than this number may be utilized in the practice of the present invention.

Figure 12:
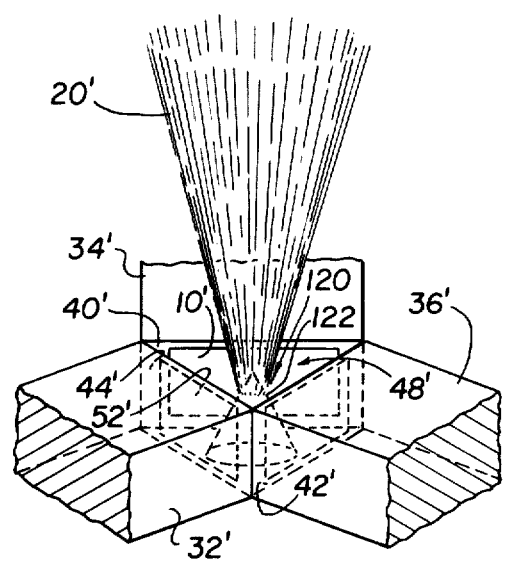
FIGS. 12 and 13 are respectively a partial perspective view and plan view of another exemplary three-cell arrangement according to the present invention.
Figure 13:
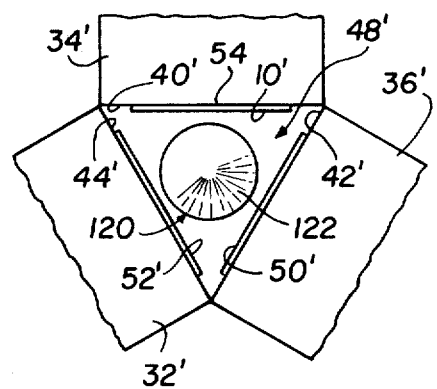

Turning now to the modified cell arrangement of FIGS. 12 and 13, wherein similar parts and components are designated by the same but primed reference numerals, the modifications thereof primarily affect only the configuration of the cell compartment 48'. Instead of a pyramidal shape, which necessitates machining the walls at appropriate angles, the walls 40', 42' and 44' are vertical and the shape of cell compartment 48' bounded by these walls is that of a simple triangle. The cells, oriented with their long dimension horizontal, are adhesively secured, in the manner already described, to said walls, viz. cell 10' to wall 40', cell 52' to wall 44', and cell 50' to wall 42'.

Using a Fresnel lens in the same manner as already described, a concentrated, conical shape of sunlight 20' is beamed into the center of the compartment 48' and reflected first onto the cells 10', 40' and 52', and then interreflected among these cells, with the result that there is efficient conversion, to a noteworthy extent, of the sunlight into electricity by said cells, all as has already been described. To achieve the initial and subsequent distribution of the concentrated sunlight 20' to the cells 10', 40', 52', use is made of a conical member 120 having a polished, external light-reflecting surface 122. Member 120 occupies a central location in the compartment 48' so that the concentrated sunlight 20' is readily focused thereon. While not shown in the partial views of FIGS. 12, 13, it will be understood that heat sinks 56, as already described, are associated with each of the blocks 32', 34', 36', and achieve the heat dissipation function as already described.

Reference should now be made to still another modified cell arrangement as shown in FIGS. 14, 15, 16 wherein similar parts and components are designated by the same but double-primed reference numerals. This arrangement, although structurally modified, like the already described arrangement, similarly optimizes conversion of sunlight directly into electricity by causing concentrated sunlight to impinge and then interreflect between silicon solar cells.

Instead of using a Fresnel lens to concentrate the sunlight into a circular shape, use is advantageously made of a lens 18" having Ronchi rulings which, as is well understood, effectively gathers sunlight 16" impinging upon it and concentrates the same, as at 20", into a rectangular shape at its principal focus. To accommodate this rectangular concentrated sunlight input, cells 10", 50", are oriented lengthwise and in facing relation so as to bound a V-shaped compartment having a rectangular entrance opening thereinto. As best shown in FIG. 15, a sunlight ray 20" that is directed into initial impingement against cell 50" will typically then reflect from cell 50" against 10", and from thence back again to cell 50", before exiting from the cell compartment.

The cells are adhesively secured, in the manner already described, to the inclined walls produced by machining a V-shape, in cross-section, in block section 34", 36". Also, in the manner already described, heat is dissipated by the finned heat sinks 58".

From what has already been described it should be apparent that the longitudinal orientation of the modified embodiment of FIGS. 15, 16 provides a shape which might be more suitable for a rooftop installation for a factory, shopping center, etc. using the within device to operate the electrical services thereof. Even more important, however, said longitudinal orientation greatly facilitates the sun-tracking requirements for the device. As shown in FIG. 16, the device lens 18" is oriented substantially parallel to the plane of movement of the sun, taking into account geographical location and time of year. This initial orientation will properly position the lens 18" for its sunlight gathering function at the sunrise and sunset positions of the sun. Tracking is only required for the intermediate rising and setting positions of the movement of the sun. Thus, appropriate means are operatively connected to urge device 18" through rotation 106" about the longitudinal axis of the device to track the sun from sunrise to its highest position of movement, and through reverse rotation 106" to complete the tracking of the sun to sunset.

In addition to the enhanced inter-reflection providing the noteworthy electricity-producing function, it should also be noted that contributing to such function is the manner in which the within improved arrangement of the silicon solar cells accommodates geometric shapes which otherwise are incompatible. Specifically, the concentrated sunlight 16 in cross-section is circular, whereas the shape of each cell 10 is rectangular. Thus, the impingement of the concentrated sunlight on a cell arranged normal or perpendicular to the path of the sunlight, as was the prior art practice, must of necessity result in inefficiency because of the incompatibility of the geometric shapes involved.

At one extreme, if the spot of impinging sunlight is undersized relative to the cell, there then must exist some surface area of the cell which is not activated by sunlight and thus not functioning to produce electricity. At the other extreme, if the spot of impinging sunlight is increased to entirely cover or envelope the rectangular cell, there then must exist some extent of concentrated sunlight which falls outside the borders of the cell and thus is not being used in the electricity-producing operation of the cell. While the latter situation is not wasteful of the surface area of the cell, it is wasteful of the volume being occupied by the device, as well as involving use of a sunlight-gathering means which is not being efficiently used, and has other shortcomings.

An important contribution of the present invention thus resides in the accommodation of the diverse geometric shapes which is provided by the improved arrangements of the silicon solar cells according to the present invention. Rather than orienting the cells normal to the path of the impinging sunlight, said cells are operatively arranged substantially in aligning relation therewith, as exemplified particularly by the embodiment of FIGS. 3–11, thereby minimizing inefficiencies resulting from mismatching of the concentrated sunlight and silicon solar cell shapes.

A latitude of modification, change and substitution is intended in the foregoing disclosure, and in some instances some features of the invention will be employed without a corresponding use of other features. Accordingly, it is appropriate that the appended claims be construed broadly and in a manner consistent with the spirit and scope of the invention herein.

What is claimed is:

1. A device for converting sunlight into electricity using silicon solar cells comprising wall means bounding a pyramidal cell compartment having an entrance opening thereinto, Fresnel lens means operatively arranged in an interposed position between the sun and said cell compartment so as to beam sunlight through said compartment entrance opening in a selected concentrated form which has a circular shape in cross-section and which approximates in size that of said compartment entrance opening, three said silicon solar cells electrically connected to each other operatively arranged on said cell compartment wall means in facing relation to each other and oriented lengthwise of said cell compartment so as to intercept said sunlight beamed through said compartment entrance opening, and heat exchange means operatively arranged in heat exchange relation to said silicon solar cells to dissipate an extent of heat from said concentrated sunlight impinging thereon to obviate any damage to said cells, whereby an optimum amount of electricity is generated by said device as a function of said concentrated sunlight input.

2. A device for converting sunlight into electricity as defined in claim 1 wherein said silicon solar cells and said heat exchange means are adhesively secured to a cooperating supporting surface by a dielectric epoxy adhesive with comparatively high thermal conductivity.

3. A device for converting sunlight into electricity as defined in claim 2 including sun-tracking means operatively arranged to urge said device in movement tracking the sun so as to contribute to the ability of said Fresnel lens means to beam said concentrated sunlight through said cell compartment entrance openings.

4. A device for converting sunlight into electricity using silicon solar cells comprising wall means bounding a cell compartment having an entrance opening thereinto, a centrally located conical light-reflecting member in said compartment, Fresnel lens means operatively arranged in an interposed position between the sun and said cell compartment so as to beam sunlight through said compartment entrance opening in a concentrated conical shape onto said conical light-reflecting member, at least three said silicon solar cells electrically connected to each other operatively arranged on said cell compartment wall means in encircling relation about said conical light-reflecting member, and heat exchange means operatively arranged in heat exchange relation to said silicon solar cells to dissipate an extent of heat from said concentrated sunlight impinging thereon to obviate any damage to said cells.

5. A device for converting sunlight into electricity as defined in claim 4 wherein each said silicon solar cell is of a rectangular shape and the long dimension of each is oriented horizontally of said cell compartment.

6. A device for converting sunlight into electricity as defined in claim 5 wherein said cell compartment is of a triangular shape bounded by vertically oriented walls.

* * * * *